(12) United States Patent
Wang et al.

(10) Patent No.: US 8,529,773 B2
(45) Date of Patent: Sep. 10, 2013

(54) METHOD FOR MAKING MICRO-ELECTRO-MECHANICAL SYSTEM DEVICE

(71) Applicants: Chuan Wei Wang, Hsin-Chu (TW); Sheng Ta Lee, Hsin-Chu (TW)

(72) Inventors: Chuan Wei Wang, Hsin-Chu (TW); Sheng Ta Lee, Hsin-Chu (TW)

(73) Assignee: PixArt Imaging Incorporation R.O.C., Hsin-Chu (TW)

( * ) Notice: Subject to any disclaimer, the term of this patent is extended or adjusted under 35 U.S.C. 154(b) by 0 days.

(21) Appl. No.: 13/632,020

(22) Filed: Sep. 30, 2012

(65) Prior Publication Data

US 2013/0102100 A1     Apr. 25, 2013

Related U.S. Application Data

(62) Division of application No. 12/270,804, filed on Nov. 13, 2008, now Pat. No. 8,303,827.

(51) Int. Cl.
*C23F 1/00*     (2006.01)

(52) U.S. Cl.
USPC ............................................................. 216/2

(58) Field of Classification Search
USPC ............................................................. 216/2
See application file for complete search history.

(56) References Cited

U.S. PATENT DOCUMENTS 6,362,512 B1 *    3/2002    Kubby et al. ................. 257/415

* cited by examiner

*Primary Examiner* — Roberts Culbert
(74) *Attorney, Agent, or Firm* — Tung & Associates

(57) ABSTRACT

The present invention discloses a method for making a MEMS device, comprising: providing a zero-layer substrate; forming a MEMS device region on the substrate, wherein the MEMS device region is provided with a first sacrificial region to separate a suspension structure of the MEMS device from another part of the MEMS device; removing the first sacrificial region by etching; and micromachining the zero-layer substrate.

8 Claims, 4 Drawing Sheets

METHOD FOR MAKING MICRO-ELECTRO-MECHANICAL SYSTEM DEVICE

This is a Divisional Application of a co-pending application Ser. No. 12/270,804, filed on Nov. 13, 2008.

BACKGROUND

1. Field of Invention

The present invention relates to a method for making a micro-electro-mechanical system (MEMS) device, in particular to a method for making a MEMS device which is compatible to a standard CMOS process and can be easily integrated with post treatment processes such as surface micromachining or bulk micromachining.

2. Description of Related Art

MEMS devices are used in a wide variety of products such as micro-acoustical sensor, gyro-sensor, accelerometer, etc. Most prior art MEMS manufacturing processes are not fully compatible with a standard CMOS process. For example, U.S. Pat. Nos. 5,490,220; 7,190,038; 7,202,101 disclose MEMS manufacturing processes which require special material or equipment that are not provided in a standard CMOS process, and thus it costs more to manufacture MEMS devices thereby. Moreover, it is often required to perform a post treatment process, such as surface micromachining or bulk micromachining, on the manufactured MEMS device to enhance the device performance. There are only few HEMS manufacturing processes that are compatible with a standard CMOS process, such as U.S. Pat. No. 5,970,315. However, this conventional process does not take into consideration how a post treatment process can be integrated therewith. Thus, it is desired to provide a method for making a MEMS device, which is fully compatible with the current CMOS process, and can be easily integrated with MEMS post treatment processes.

SUMMARY

It is an objective of the present invention to provide a method for making a MEMS device, which is fully compatible with the current CMOS process, and can be easily integrated with post treatment processes such as surface micromachining or bulk micromachining.

In accordance with the foregoing and other objectives of the present invention, and from one aspect of the present invention, the present invention discloses method for making a MEMS device, comprising: providing a zero-layer substrate; forming a MEMS device region on the substrate, wherein the HEMS device region is provided with a first sacrificial region to separate a suspension structure of the MEMS device from another part of the MEMS device; removing the first sacrificial region by etching; and micromachining the zero-layer substrate.

In the above method, the step of removing the first sacrificial region and the step of micromachining the zero-layer substrate can be performed in any order.

The micromachining step in the method may be surface micromachining, or bulk micromachining, or both.

In one embodiment, the zero-layer substrate is a silicon substrate, and the surface micromachining step includes isotropically etching the zero-layer substrate by XeF2.

In another embodiment, the zero-layer substrate is a silicon substrate, and the bulk micromachining step includes: anisotropically etching the zero-layer substrate from its back side to reduce its thickness in a selected region, followed by anisotropically etching the zero-layer substrate from its top side. The anisotropic etch may be ICP (Inductively Coupled Plasma) etch.

It is to be understood that both the foregoing general description and the following detailed description are provided as examples, for illustration and not for limiting the scope of the invention.

BRIEF DESCRIPTION OF THE DRAWINGS

These and other features, aspects, and advantages of the present invention will become better understood with regard to the following description, appended claims, and accompanying drawings.

DESCRIPTION OF THE PREFERRED EMBODIMENTS

The drawings as referred to throughout the description of the present invention are for illustration only, but not drawn according to actual scale.

Figure 1A:
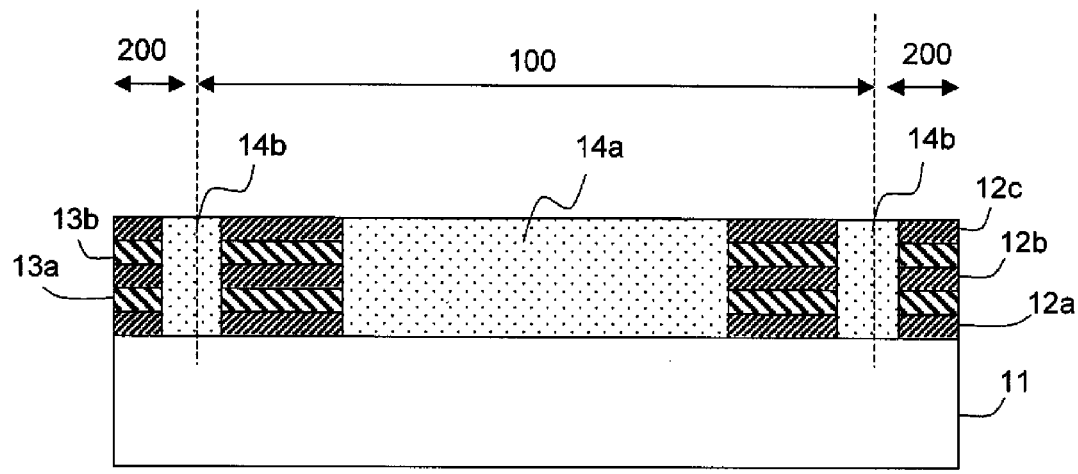
FIGS. 1A-1D show an embodiment according to the present invention.

Referring to FIG. 1A for the first embodiment of the present invention, a zero-layer wafer substrate 11 is provided, which for example can be a silicon wafer so that the process is compatible with a standard CMOS process. Next, transistor devices can be formed by standard CMOS process steps as required (not shown), followed by deposition, lithography and etch steps to form interconnection including a contact layer 12a, a first metal layer 13a, a first via layer 12b, a second metal layer 13b, and a second via layer 12c. In one embodiment, the contact layer and the via layers can be made of tungsten; the metal layers can be made of aluminum; and the dielectric layer can be made of oxides such as silicon dioxide. Other conductive or dielectric materials can be used to replace what are suggested above, and the structure can include more or less number of metal layers. The pattern of each of the layers 12a-12c and 13a-13b is thus that a sacrificial region 14a and an isolation region 14b are formed therein. The detailed pattern of each layer is not shown for simplicity of the drawings. The regions 14a and 14b may be made of the same or different materials; in this embodiment they are both made of an oxide, such as silicon dioxide. The sacrificial region 14a is provided so that the suspension structure of the MEMS device to be manufactured is separated from the silicon substrate (also referring to FIG. 1D). The isolation region 14b is provided to isolate the MEMS device region 100 from the other circuit region 200; its cross sectional pattern need not be exactly as shown but can be of any other shape.

Figure 1B:
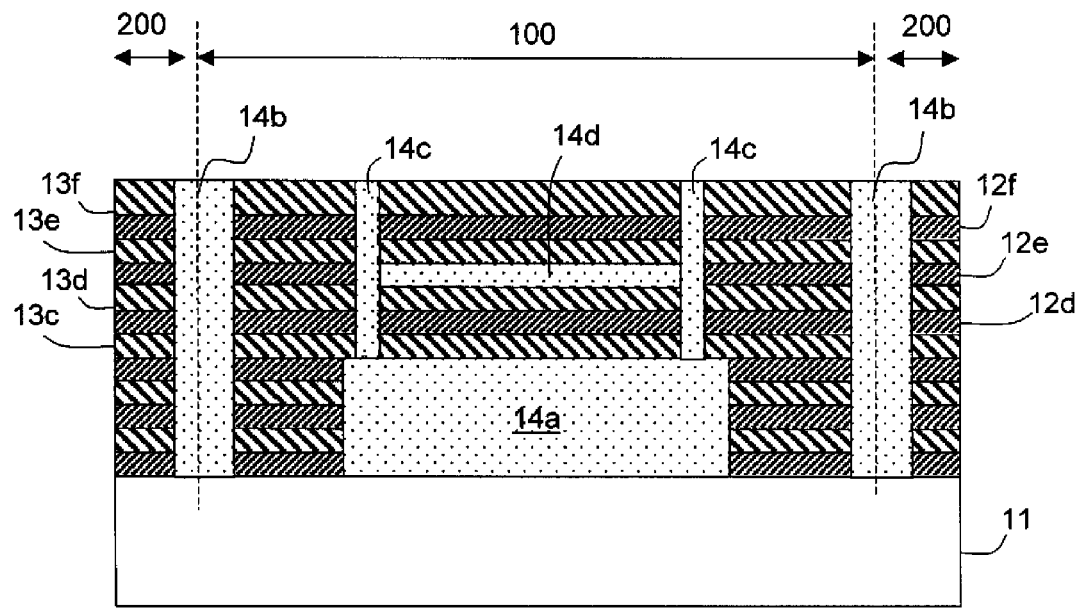

Referring to FIG. 1B, next via layers 12d-12f and metal layers 13c-13f are deposited to form the MEMS structure. The number of the via layers and metal layers can be modified; what is shown is only one example. A sacrificial region 14c is formed to separate the suspension structure of the MEMS device from another part of the MEMS device. According to the design of the MEMS device structure, in this embodiment, a sacrificial region 14d is also formed to separate an upper structure of the MEMS device from a lower structure thereof (also referring to FIG. 1C). This sacrificial region 14d can be omitted if the suspension structure of the MEMS device is one integrated body. The sacrificial regions 14c and 14d can be made of oxides such as silicon dioxide. The sacrificial regions 14a, 14c and 14d and the isolation region 14b can be formed concurrently with the patterns of the via layers and the metal layers.

Figure 1C:
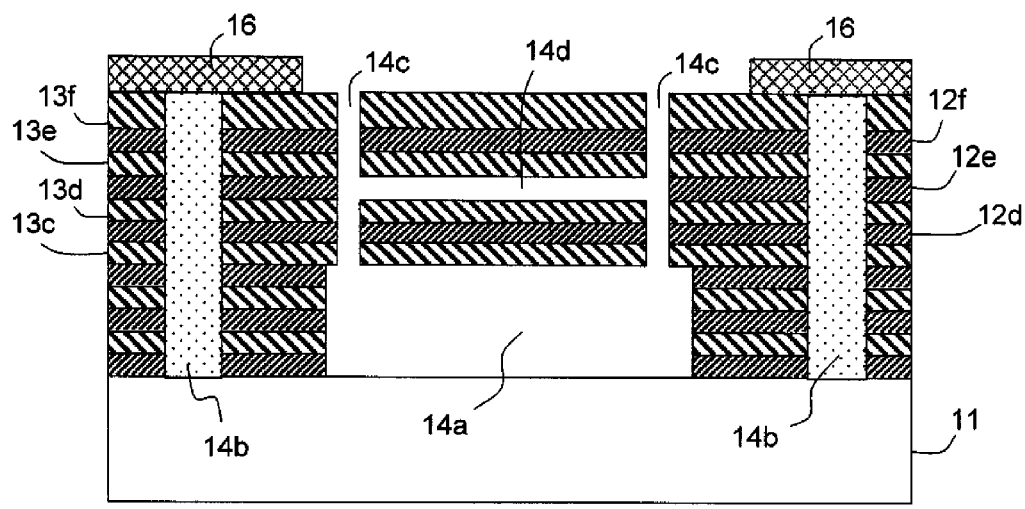

Referring to FIG. 1C, in one embodiment, a mask 16 is formed and patterned; and an etch step is performed to remove the oxides in the sacrificial regions 14a, 14c and 14d (for better identification of these sacrificial regions, the sacrificial region 14c is also referred to as the first sacrificial region, the sacrificial region 14d is also referred to as the second sacrificial region, and the sacrificial region 14a is also referred to as the third sacrificial region). The mask 16 shields the regions other than the sacrificial regions to protect those other regions from etching. The etch for example can be HF (hydrogen fluoride) vapor etch, or BOE (buffered oxide etch) by immersing the whole wafer in an acid tank. The mask 16 for example can be a photoresist layer patterned by lithography, or made of other single or composite materials, such as metal or amorphous silicon. Since a purpose of the mask 16 is to protect the other circuit region 200, a passivation layer which is often used in the circuit region may be used as the mask 16. The passivation layer may be a nitride layer or a bi-layer structure including an oxide layer and a nitride layer.

Figure 1D:
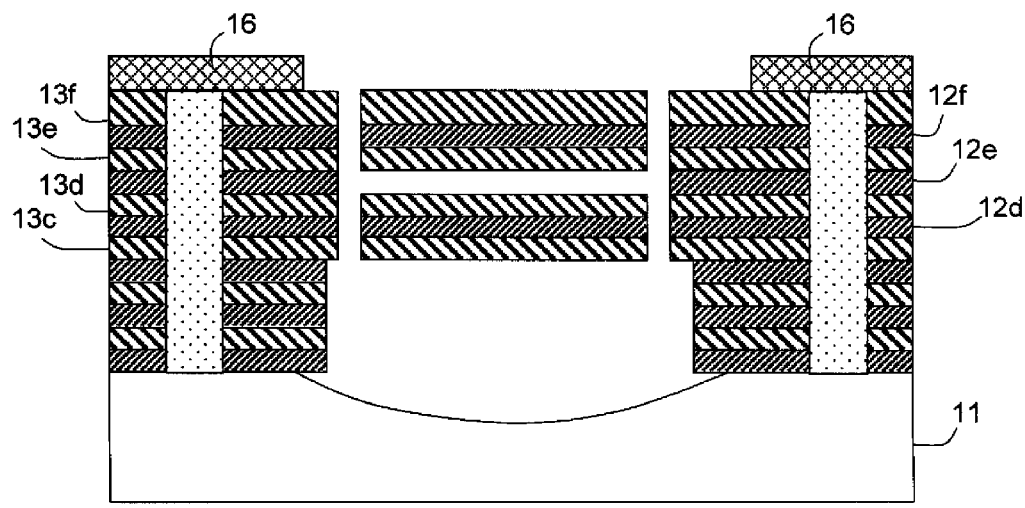

Referring to FIG. 1D, after the sacrificial regions are removed, a surface micromachining step is taken to etch the zero-layer silicon substrate from its top side. The etch step for example is an isotropic etch by XeF2 gas. If the mask 16 is a photoresist layer which has not yet been totally consumed, it can be removed after the step of FIG. 1D. If the mask 16 is a layer with some other function, such as the passivation layer described above, then the process stops at the step of FIG. 1D, and a desired MEMS device is obtained.

Figure 2A:
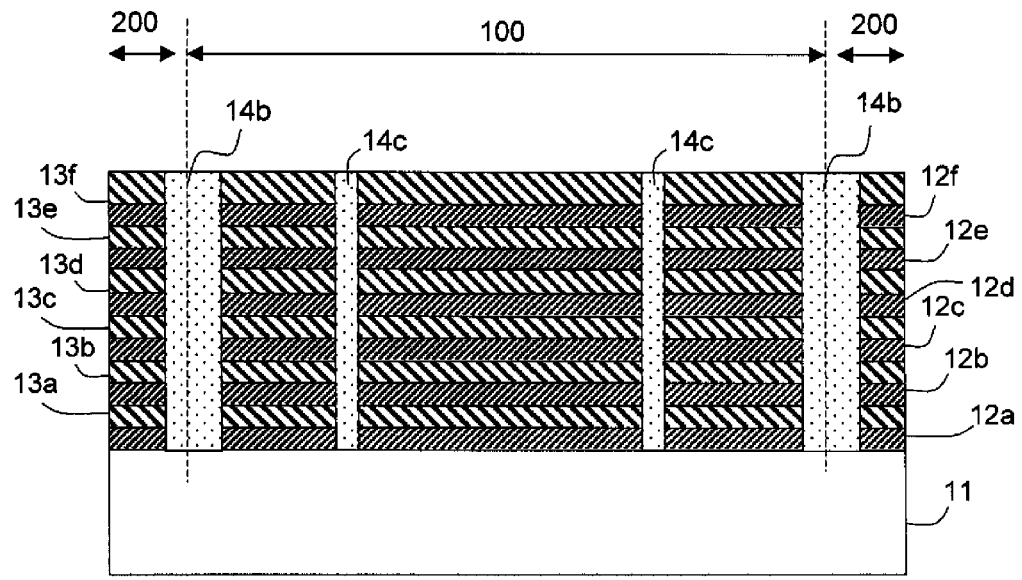
FIGS. 2A-2D show another embodiment according to the present invention.

Now referring to FIG. 2A for the second embodiment of the present invention, a zero-layer wafer substrate 11 is provided, which for example can be a silicon wafer so that the process is compatible with a standard CMOS process. Next, transistor devices can be formed by standard CMOS process steps as required (not shown), followed by deposition, lithography and etch steps to form a contact layer 12a, via layers 12b-12f, and metal layers 13a-13f. Similar to the previous embodiment, the contact layer and the via layers can be made of tungsten; the metal layers can be made of aluminum; and the dielectric layer can be made of oxides such as silicon dioxide. The suspension structure of the MEMS device in this embodiment is different from that of the previous embodiment, so it is not necessary to form a sacrificial region 14a (but can be formed if desired); however an isolation region 14b is preferably formed to isolate the MEMS device region 100 from the other circuit region 200. A sacrificial region 14c is also formed depending on the design of the MEMS device. The isolation region 14b and the sacrificial region 14c can be made of oxides such as silicon dioxide. The sacrificial region 14d in the previous embodiment is not shown in the figure, but it can be provided if required.

Figure 2B:
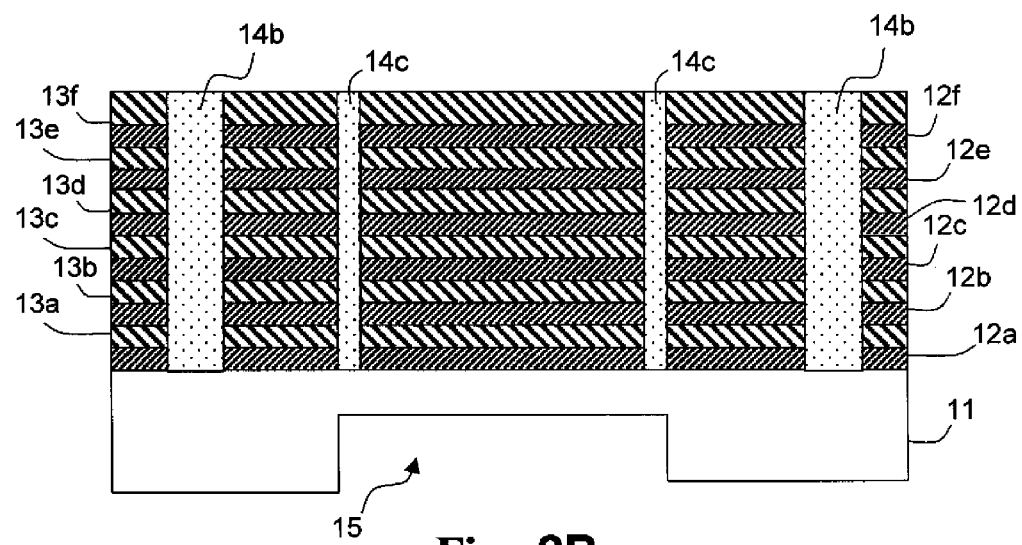

Next referring to FIG. 2B, to form the desired MEMS structure, an anisotropic etch step is taken from the back side of the substrate, forming a recess region 15 at the back side of the substrate to reduce the thickness of the substrate in this region. The etch step for example can be an ICP (Inductively Coupled Plasma) etch. This step is part of the bulk micromachining process. Alternatively, this step can be taken after the step of FIG. 2C.

Figure 2C:
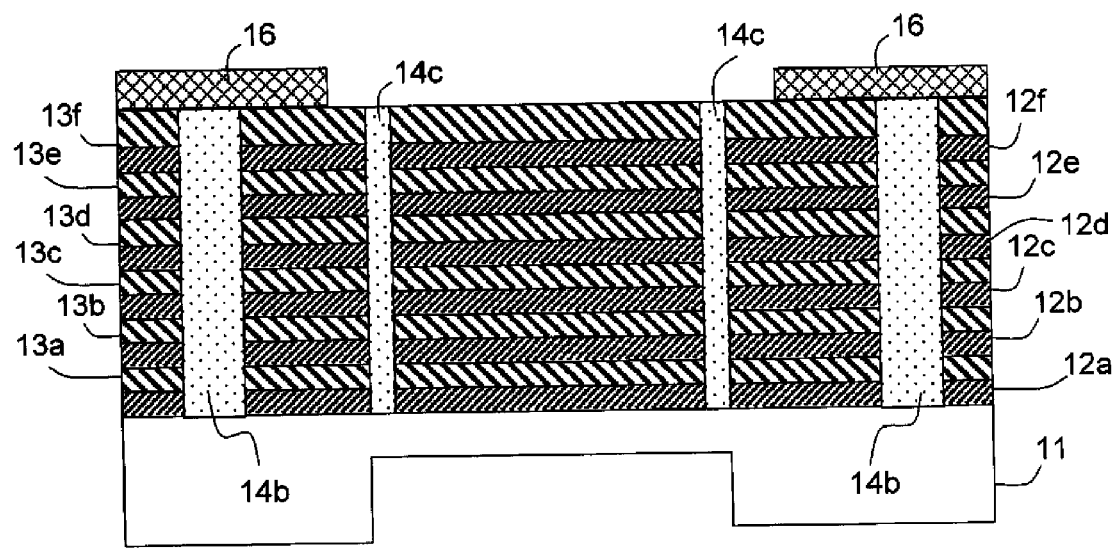

Referring to FIG. 2C, in one embodiment, a mask 16 is formed and patterned; and an etch step is performed to remove the oxide in the sacrificial region 14c. The mask 16 shields the regions other than the first sacrificial region to protect those other regions from etching. The etch for example can be HF (hydrogen fluoride) vapor etch, or BOE (buffered oxide etch) by immersing the whole wafer in an acid tank. The mask 16 for example can be a photoresist layer, or other single or composite material layers, such as metal layer, amorphous silicon layer, or passivation layer which is often used in the circuit region. The passivation layer may be a nitride layer or a bi-layer structure including an oxide layer and a nitride layer.

Figure 2D:
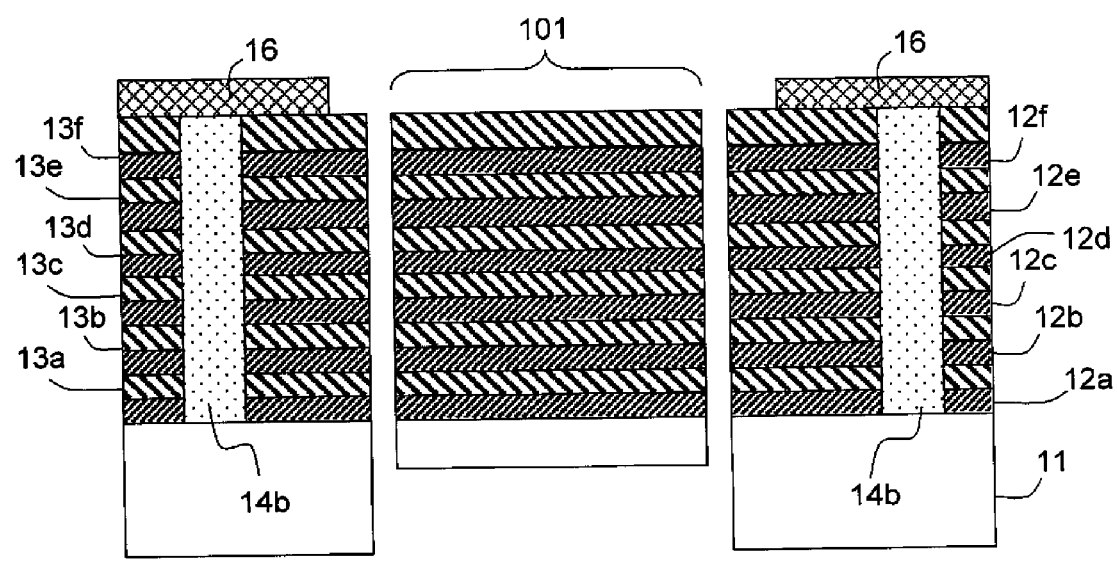

Referring to FIG. 2D, after the sacrificial region 14c is removed, an etch step is taken to etch the zero-layer silicon substrate, by ICP etch for example, to complete the MEMS device. Similar to the previous embodiment, if the mask 16 is a photoresist layer which has not yet been totally consumed, it can be removed. If the mask 16 is a layer with some other function, it can be kept. This embodiment is different from the previous embodiment in that the suspension structure 101 of the MEMS device includes the silicon substrate.

It can be readily understood by those skilled in this art from the foregoing description of the embodiments that the front end process of the first and second embodiments are identical (FIGS. 1A-1B and FIG. 2A, and even FIG. 1C and FIG. 2B), except the layout may be different. Thus, according to the present invention, a wafer may be processed by the same steps to form a basic structure, and thereafter subject to surface and bulk micromachining processes at different locations on the same wafer. Such flexibility does not exist in prior art, and therefore the present invention is better.

Although the present invention has been described in detail with reference to certain preferred embodiments thereof, the description is for illustrative purpose and not for limiting the scope of the invention. For example, the materials, number of metal layers, etch details, and so on, can be modified without departing from the spirit of the present invention. One skilled in this art can readily think of other modifications and variations in light of the teaching by the present invention. In view of the foregoing, it is intended that the present invention cover all such modifications and variations, which should interpreted to fall within the scope of the following claims and their equivalents.

What is claimed is:

1. A method for making a micro-electro-mechanical system (MEMS) device, comprising:
   providing a zero-layer substrate;
   forming a MEMS device region on the substrate, wherein the MEMS device region is provided with a first sacrificial region to laterally separate a suspension structure of the MEMS device from another part of the MEMS device;
   removing the first sacrificial region, wherein the step of removing the first sacrificial region includes: depositing and patterning a mask layer to shield regions other than the first sacrificial region, followed by lateral etching; and
   bulk-micromachining the zero-layer substrate, wherein the step of removing the first sacrificial region and the step of bulk-micromachining the zero-layer substrate can be performed in any order.

2. The method of claim 1, wherein the bulk-micromachining step includes: etching the zero-layer substrate from its back side to reduce its thickness in a selected region, and etching the zero-layer substrate from its top side.

3. The method of claim 2, wherein the back side etching and top side etching steps are anisotropic etch.

4. The method of claim 3, wherein the zero-layer substrate is a silicon substrate, and the anisotropic etch includes ICP (Inductively Coupled Plasma) etch.

5. The method of claim 1, further comprising: forming a second sacrificial region in the suspension structure of the MEMS device, and wherein the step of removing the first sacrificial region also removes the second sacrificial region.

6. The method of claim 1, wherein the first sacrificial region is made of oxide, and the etching step includes hydrogen fluoride vapor etch or buffered oxide etch.

7. The method of claim 1, wherein the mask layer includes one selected from the group consisting of:
   metal layer, amorphous silicon layer, nitride layer, and bi-layer structure of oxide and nitride.

8. The method of claim 1, further comprising: forming a third sacrificial region to separate the suspension structure of the MEMS device from the substrate, and removing this third sacrificial region in the step of removing the first sacrificial region.

* * * * *